United States Patent
Light et al.

(10) Patent No.: US 9,330,914 B2
(45) Date of Patent: May 3, 2016

(54) METHODS OF FORMING LINE PATTERNS IN SUBSTRATES

(71) Applicant: Micron Technology, Inc., Boise, ID (US)

(72) Inventors: Scott L. Light, Boise, ID (US); Vishal Sipani, Boise, ID (US); Michael D. Hyatt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 108 days.

(21) Appl. No.: 14/049,135

(22) Filed: Oct. 8, 2013

(65) Prior Publication Data

US 2015/0099362 A1    Apr. 9, 2015

(51) Int. Cl.
H01L 21/311    (2006.01)
H01L 21/033    (2006.01)

(52) U.S. Cl.
CPC .................................. *H01L 21/0337* (2013.01)

(58) Field of Classification Search
CPC .................................................. H01L 21/0337
USPC ............................................ 438/694; 216/44
See application file for complete search history.

(56) References Cited

U.S. PATENT DOCUMENTS

| | | | |
|---|---|---|---|
| 6,107,161 A | 8/2000 | Kitaguro et al. | |
| 6,168,907 B1 | 1/2001 | Choi et al. | |
| 6,361,928 B1 | 3/2002 | Yang et al. | |
| 6,955,961 B1 | 10/2005 | Chung | |
| 7,378,215 B2 | 5/2008 | Yamaguchi et al. | |
| 7,521,808 B2 | 4/2009 | Furukawa et al. | |
| 7,923,373 B2 | 4/2011 | Sandhu | |
| 2007/0004101 A1 | 1/2007 | Lim | |
| 2008/0057445 A1 | 3/2008 | Brueck et al. | |
| 2008/0064213 A1 | 3/2008 | Jung | |
| 2008/0176767 A1* | 7/2008 | Millward | 506/20 |
| 2008/0220600 A1 | 9/2008 | Alapati et al. | |
| 2008/0220616 A1 | 9/2008 | Matsui et al. | |
| 2008/0274413 A1 | 11/2008 | Millward | |
| 2008/0299487 A1 | 12/2008 | Chang | |
| 2008/0299774 A1 | 12/2008 | Sandhu | |

(Continued)

FOREIGN PATENT DOCUMENTS

| | | |
|---|---|---|
| CN | 201180026970.3 | 5/2015 |
| KR | 10-2009-0102218 | 9/2009 |

(Continued)

OTHER PUBLICATIONS

McLellan, P.; DirectedSelf-Assembly; SemiWiki.com; Jul. 19, 2012; 2 pp.

Tiron et al..; The potential of block copolymer's directed self-assembly for contact hole shrink and contact multiplication; Proc of SPIE vol. 8680; Mar. 26, 2013; 12 pp.

(Continued)

*Primary Examiner* — Roberts Culbert
(74) *Attorney, Agent, or Firm* — Wells St. John, P.S.

(57) ABSTRACT

A method including forming a line pattern in a substrate includes using a plurality of longitudinally spaced projecting features formed along respective guide lines as a template in forming a plurality of directed self-assembled (DSA) lines that individually comprise at least one of (a): the spaced projecting features and DSA material longitudinally therebetween, and (b): are laterally between and laterally spaced from immediately adjacent of the guide lines. Substrate material elevationally inward of and laterally between the DSA lines may be processed using the DSA lines as a mask.

38 Claims, 7 Drawing Sheets

(56) References Cited

U.S. PATENT DOCUMENTS

| | | |
|---|---|---|
| 2009/0017628 A1 | 1/2009 | Kim et al. |
| 2009/0053657 A1 | 2/2009 | Hatakeyama et al. |
| 2009/0227057 A1 | 9/2009 | Suzuki |
| 2009/0239382 A1 | 9/2009 | Zhu |
| 2010/0068657 A1 | 3/2010 | Yang |
| 2010/0163180 A1 | 7/2010 | Millward |
| 2010/0170870 A1 | 7/2010 | Lee et al. |
| 2011/0033786 A1 | 2/2011 | Sandhu |

FOREIGN PATENT DOCUMENTS

| | | |
|---|---|---|
| KR | 10-2009-0106884 | 10/2009 |
| WO | PCT/US2011/035721 | 3/2012 |
| WO | PCT/US2011/035721 | 12/2012 |

OTHER PUBLICATIONS

Yang et al.; Complex self-assembled patterns using sparse commensurate templates with locally varying motifs; Nature Nanotechnology; www.nature.com/naturenanotechnology; 2010; pp. 1-5.

Chaudhury, M.; Self-Assembled Monolayers on Polymer Surfaces; Elsevier Science Ltd,; Boisensors & Bioelectronics 10; 1995; pp. 785-788.

Lai et al.; Computational Aspects of Optical Lithography Extension by Directed Self-Assembly; Proc. SPIE 8683, Optical Microlithography XXVI, Apr. 12, 2013; pp. 1-13.

Self-Assembled Monolayers on Polymer Surfaces: Kinetics Functionalization, and Photopatteming; Bhme et al., Langmuir vol. 15, No. 16; Jun. 10, 1999; 5323-5328.

US 8,123,960, 02/2012, Millward (withdrawn)

* cited by examiner

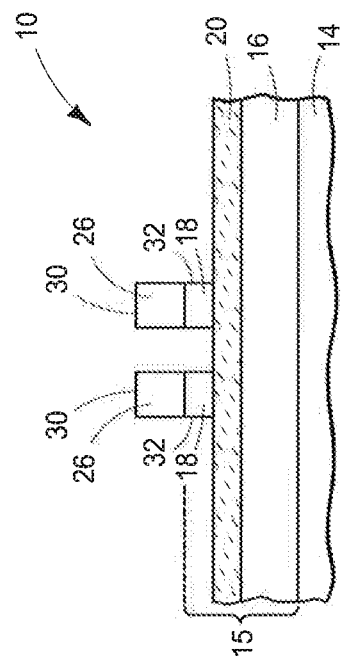
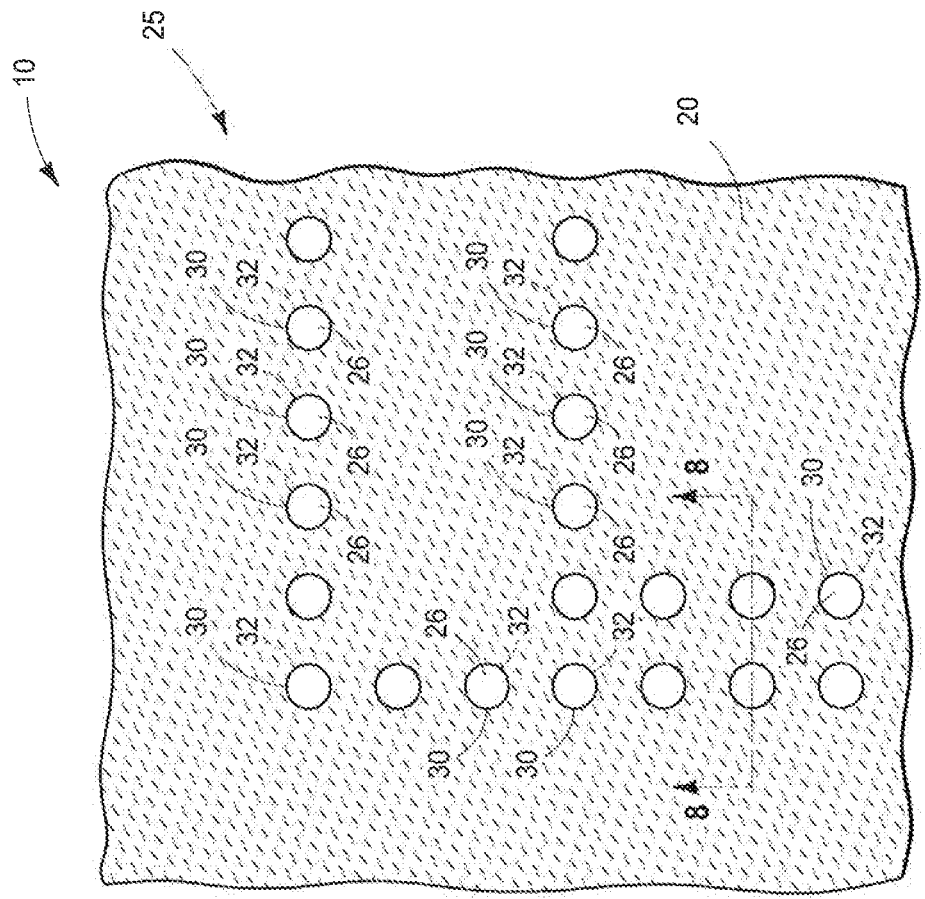

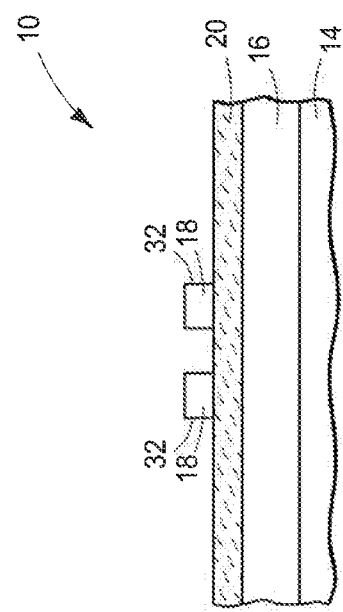
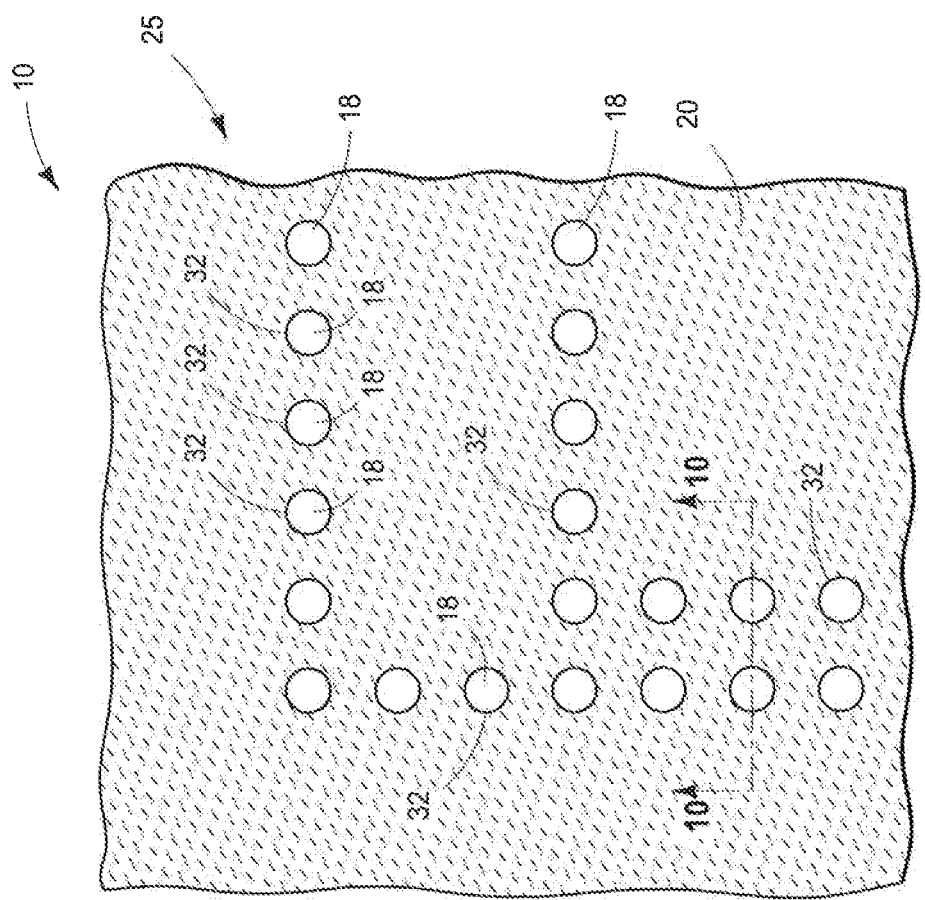

US 9,330,914 B2

METHODS OF FORMING LINE PATTERNS IN SUBSTRATES

TECHNICAL FIELD

Embodiments disclosed herein pertain to methods of forming line patterns in substrates.

BACKGROUND

A continuing goal in the fabrication of integrated circuitry is to increase integration density by both making individual components smaller and packed closer together. This goal permeates throughout fabrication of all types of circuitry. One component of integrated circuitry are lines (i.e., an elongated structure which is overall longer than it is wide). Lines may be composed of one or more of dielectric material, semiconductive material, and conductive material (including conductively-doped semiconductive material). The lines may be any of one or more of straight, curved, curvilinear, combinations of differently angled straight segments, combinations of straight and curved linear segments (e.g., in racetrack-like patterns or in rings), etc. In many instances, lines are formed in arrays of a large number of repeating units, such as transistor gate lines, isolation lines, conductive interconnect lines, etc.

Photolithography is a conventional method used for fabrication of integrated circuitry components including the lines referred to above. Photolithography uses incident radiation to pattern openings through a photosensitive material. The patterned material may then be used as a mask for processing underlying materials in forming the desired regions and integrated circuitry components. Using photolithography alone, integrated circuitry density cannot be increased beyond a threshold dictated by the minimum attainable feature size using photolithography. Such feature size may be dictated by, for example, a wavelength used during the photolithography. To overcome such limitations, pitch multiplication techniques have been used.

BRIEF DESCRIPTION OF THE DRAWINGS

FIG. 7 is a diagrammatic top plan view of the FIG. 5 substrate at a processing step subsequent to that shown by FIG. 5.

FIG. 8 is a sectional view taken through line 8-8 in FIG. 7.

FIG. 9 is a diagrammatic top plan view of the FIG. 7 substrate at a processing step subsequent to that shown by FIG. 7.

FIG. 10 is a sectional view taken through line 10-10 in FIG. 9.

DETAILED DESCRIPTION OF EXAMPLE EMBODIMENTS

Figure 2:
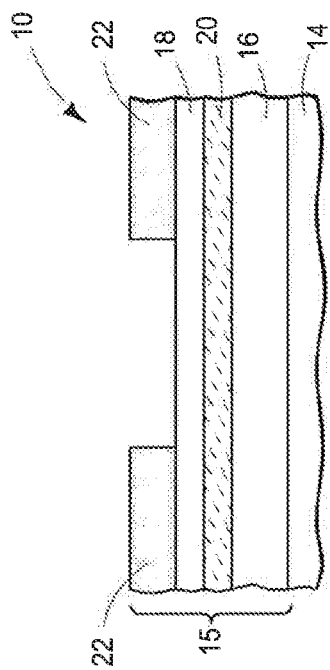
FIG. 2 is a sectional view taken through line 2-2 in FIG. 1.

In accordance with some aspects of the invention, a method includes forming a line pattern in a substrate and in one embodiment comprises using a plurality of longitudinally spaced projecting features formed along respective guidelines as a template in forming a plurality of directed self-assembled (DSA) lines that individually comprise the spaced projecting features and DSA material longitudinally therebetween. In one embodiment, a plurality of longitudinally spaced projecting features formed along respective guidelines is used as a template in forming a plurality of DSA lines that individually are laterally between and laterally spaced from immediately adjacent of the guidelines (i.e., in at least one vertical cross section). The spaced projecting features may themselves be formed using directed self-assembly. Regardless, substrate material that is elevationally inward of and laterally between the DSA lines is processed using the DSA lines as a mask in some embodiments.

In the context of this document, directed self-assembly is a process using a deposited material that comprises some mixture of at least two components which can be induced to separate relative each other (i.e., self-assemble) using a pattern previously formed (e.g., physically and/or chemically) on a substrate whereby at least some amplification of at least part of the pattern occurs by the act of separation/self-assembly. By way of examples only, materials that may be used in directed self-assembly include one or more polymers, including copolymers derived from two or more different monomeric species. Examples include block copolymers, for example containing two or more homopolymer subunits linked by covalent bonds. The union of homopolymer subunits may use an intermediate non-repeating linkage known as a junction block. The term "block copolymer" is generic for any heterogenous polymeric material that can microphase separate to form domains on sub-lithographic length scales. Block copolymers may be, for example, organic, organo-metallic, or organo-silicon. Block copolymers are commonly identified by the number of distinct homopolymer subunits contained therein. For example, block copolymers containing only two distinct homopolymer units are commonly referred to as diblock copolymers, while block copolymers containing only three distinct homopolymer subunits are commonly referred to as triblock copolymers. Regardless, materials used in directed self-assembly may form surface-parallel cylinders and/or lamellae upon self-assembly, by way of examples. Example diblock copolymers include polystyrene-b-polydimethyl-siloxane block copolymers, polystyrene-b-polymethyl-methacrylate block copolymers, polyethyleneoxide-b-polyisoprene block copolymers, polyethyleneoxide-b-polybutadiene block copolymers, polyethyleneoxide-b-poly-styrene block copolymers, polyethyleneoxide-b-polymethylmethacrylate block copolymers, polystyrene-b-polyvinylpyridine block copolymers, polystyrene-b-polyisoprene block copolymers, polystyrene-b-polybutadiene block copolymers, polybutadiene-b-polyvinylpyridine block copolymers, polyisoprene-b-polymethylmethacrylate block copolymers, and combinations thereof. Example triblock and/or multiblock copolymers include block copolymers having three or more blocks selected from the group consisting of polystyrenes, polyalkyl(meth)acrylates (e.g., polymethyl-methacrylate), polyalkyleneoxides (e.g., polyethyleneoxide), polyolefins (e.g., polyisoprene and polybutadiene), polyvinylpyridines, and combinations thereof.

Figure 1:
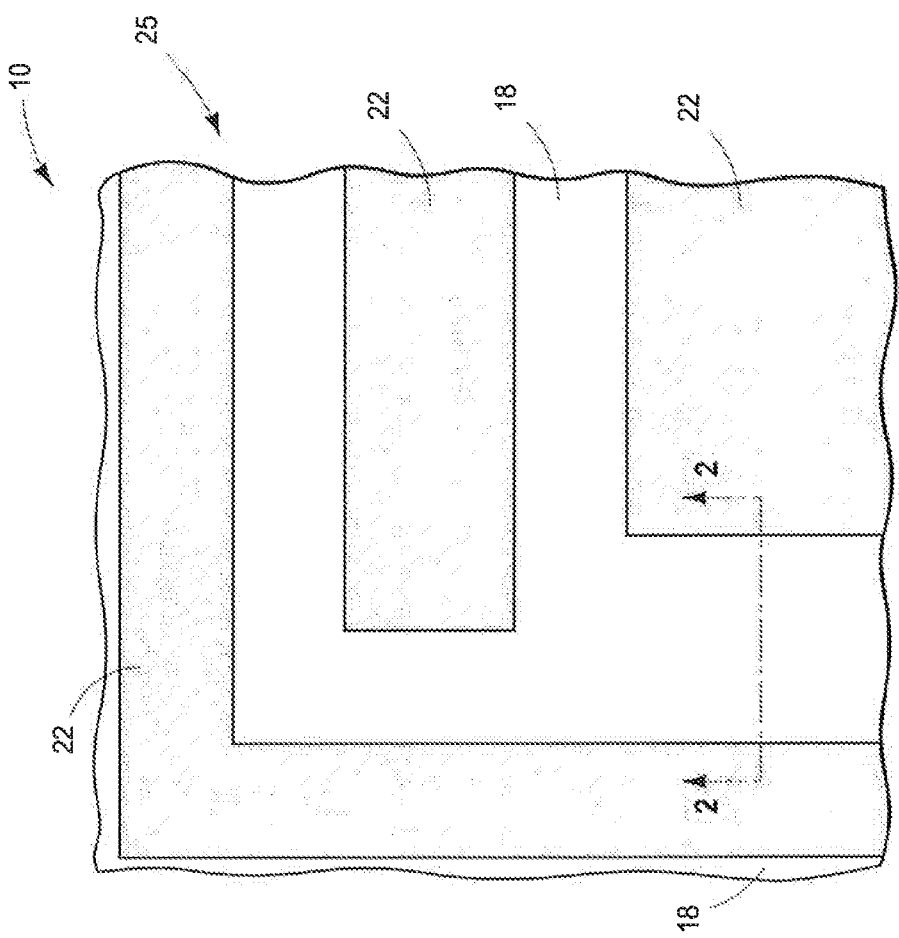
FIG. 1 is a diagrammatic top plan view of a substrate in process in accordance with an embodiment of the invention.

Example methods of forming a line pattern in a substrate are first described with reference to FIGS. 1-19. Referring to FIGS. 1 and 2, a substrate in process is indicated generally with reference numeral 10, and may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Any of the materials and/or structures described herein may be homogenous or non-homogenous, and regardless may be continuous or discontinuous over any material which such overlie. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Example substrate 10 comprises some base substrate 14 and material 15 formed elevationally there-over (FIG. 2). As examples only, material 15 comprises material 16 formed elevationally over substrate 14 and from which a plurality of lines will be formed. Material 15 also comprises different composition hard masking materials 18 and 20 that have been formed over material 16, and in some embodiments are referred to as a first material and a second material, respectively. A masking material 22 is elevationally over first material 18, and a pattern 25 (FIG. 1) has been formed therein. Fewer or more materials may be used. In one embodiment, masking material 22 comprises photoresist within which pattern 25 has been formed. Alternately by way of example only, pattern 25 and masking material 22 may have been formed using an overlying pattern in photoresist or other material (not shown). For example, a pattern may have been formed in photoresist that overlies masking material 22, with masking material 22 then having been etched using that photoresist as a mask, and which is thereafter removed. Other techniques may be used.

Figure 3:
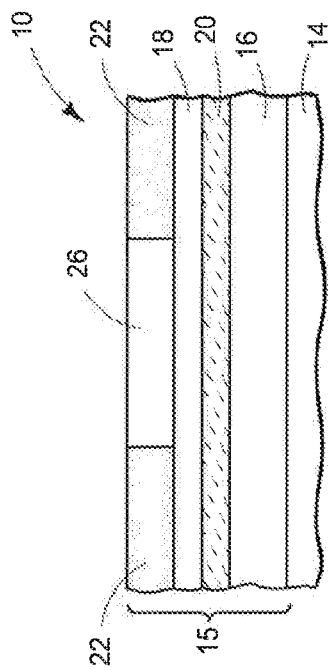
FIG. 3 is a view of the FIG. 2 substrate at a processing step subsequent to that shown by FIGS. 1 and 2.

Referring to FIG. 3, a material 26 capable of directed self-assembly has been formed over material 15. Example materials include those described above. Material 26 is shown as having an elevationally outermost surface which is elevationally coincident with that of masking material 22 although alternate configurations may be used, such as material 26 being elevationally over masking material 22. Material 26 in some embodiments may be considered as a first self-assembly material.

Figure 4:
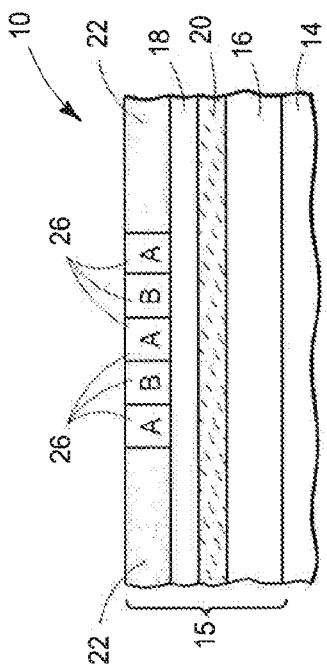
FIG. 4 is a view of the FIG. 3 substrate at a processing step subsequent to that shown by FIG. 3.

Referring to FIG. 4, directed self-assembly of material 26 has been induced whereby separation of two materials therein has occurred, for example separation of two "A" and "B" components that previously was a largely indistinct mixture within material 26. Such inducing to form the example "A" and "B" components may occur by any existing or yet-to-be-developed methods likely dependent on the composition of material 26, with annealing and/or solvent processing being examples only. The "A" and "B" components may be the same size (as shown) relative one another or may be of different sizes (not shown). Further the "A" and "B" components may have the same or different shapes relative one another in one or more cross-sections. Additionally, material 26 may be capable of separation into more than two components (not shown). The artisan is capable of selecting suitable materials and conditions for the depicted or desired self-assembly.

Figure 5:
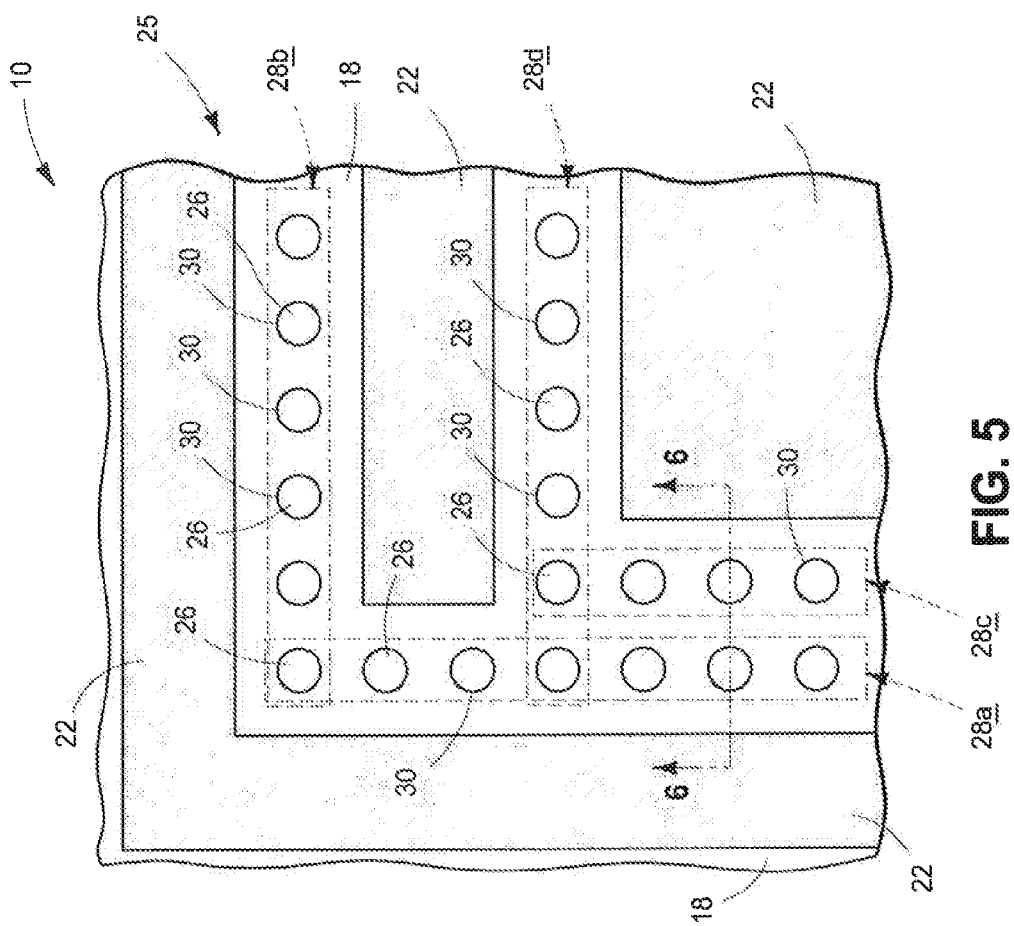
FIG. 5 is a diagrammatic top plan view of the FIG. 4 substrate at a processing step subsequent to that shown by FIG. 4.
Figure 6:
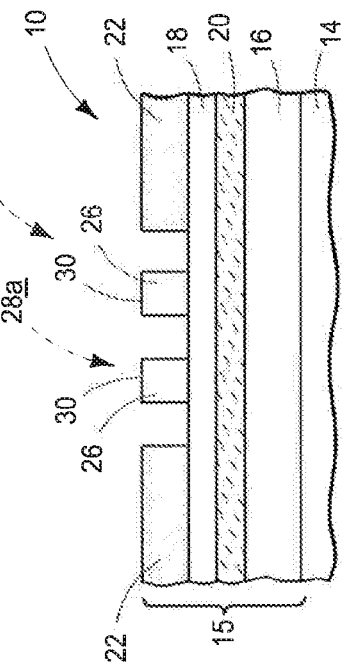
FIG. 6 is a sectional view taken through line 6-6 in FIG. 5.

Referring to FIGS. 5 and 6, the "A" component of assembled material 26 has been removed, forming a two dimensional pattern of first lines 28a, 28b, 28c, and 28d that individually comprise longitudinally spaced first projecting features 30. In some embodiments, first projecting features 30 may be considered as spaced raised features 30, as referred to below. In some embodiments, lines 28a-28d may be considered as guidelines of a template, as described below. Spaced first features 30 may be of the same shape and/or size relative one another. Further spaced first features 30 may be equally spaced relative one another and/or sidewalls of masking material 22. Alternate configurations may result or be used (e.g., one or more of different size, shape, distance from each other, and distance from sidewalls of masking material 22). Some of individual first lines 28a-28d may share some first features 30, for example as shown. Immediately laterally adjacent first features 30 of lines 28a and 28c are shown to be longitudinally aligned, although longitudinally-offset and other configurations may occur/be used.

First lines 28a-28d are shown as being straight-linear, although other orientations may be used. For example, the first lines may be formed to be non-linear, such as curvilinear, combinations of curved and straight segments, combinations of differently angled straight segments, combinations of straight and curved linear segments (e.g., in racetrack-like patterns or in rings), etc. Regardless, reference to "lines" of features 30 herein encompasses all and less-than-all of longitudinally aligned spaced projections that may be in-line, for example including only two or three immediately adjacent spaced projections formed along some segment that is overall longer than it is wide in horizontal cross section. Spaced features 30 may be of any suitable shape in horizontal cross section, with circular, triangular, and quadrilateral being examples. In one embodiment, the spaced first features are not longitudinally elongated in horizontal cross section in longitudinal direction of the line.

Referring to FIGS. 7 and 8, and in one embodiment, first material 18 has been etched selectively relative to second material 20 using first features 30 as a mask, forming second projecting features 32 which comprise first material 18. In the context of this document, a selective etch requires removal of one exposed material relative to another exposed material at a volumetric removal rate of at least 1.5:1. FIGS. 7 and 8 show masking material 22 (not shown) as having been removed. Such may occur after, prior to, and/or while conducting the example removal of first material 18. Alternately, some or all of masking material 22 may not be removed (not shown). Additionally as examples, processing may be conducted whereby second material 20 is at least partially etched into (not shown). Additionally, etching might be conducted completely through second material 20 and partially or wholly into or through material 16 (not shown). FIGS. 7 and 8 also show removal of all first material 18 laterally of first features 30. Alternately by way of example only, first material 18 may be at least partially patterned laterally of features 30 by separate masking and etching (not shown). Regardless, in one embodiment, second projecting features 32 have been formed in material underlying first features 30 (e.g., material 15) using first features 30 as a mask.

Referring to FIGS. 9 and 10, and in one embodiment, first features 30 (not shown) have been removed from the substrate.

Figure 11:
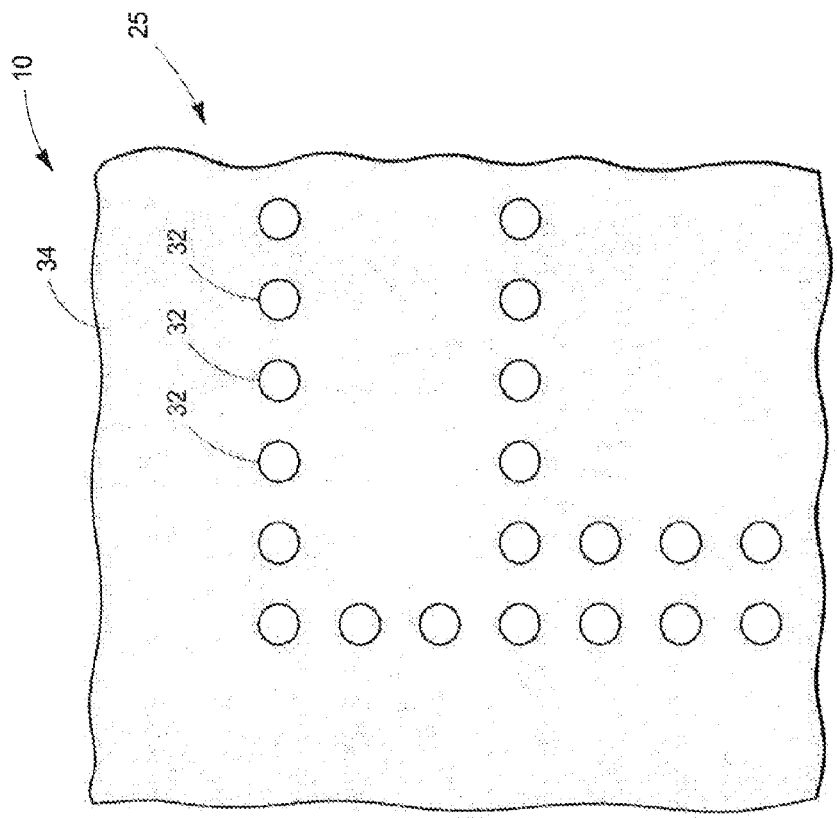
FIG. 11 is a diagrammatic top plan view of the FIG. 9 substrate at a processing step subsequent to that shown by FIG. 9.
Figure 13:
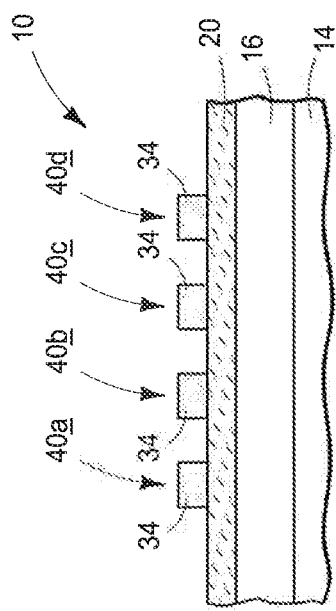
FIG. 13 is a sectional view taken through line 13-13 in FIG. 12.
Figure 14:
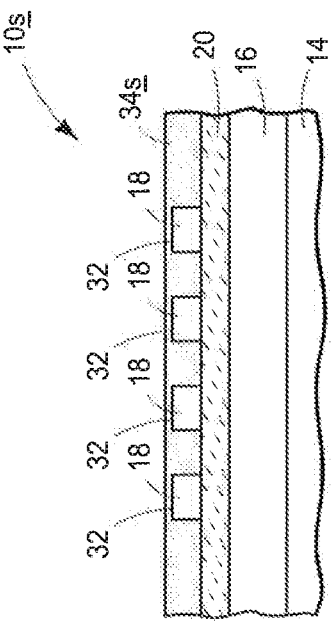
FIG. 14 is a sectional view taken through line 14-14 in FIG. 12.

Referring to FIG. 11, another material 34 capable of directed self-assembly has been formed over (i.e., laterally and/or elevationally) second projecting features 32. Material 34 in some embodiments may be considered as a second self-assembly material. FIG. 11 shows an example embodiment wherein second self-assembly material 34 is not elevationally over second features 32. Alternately by way of example, second self-assembly material 34 may be formed elevationally over second projecting features 32 (not shown). Second self-assembly material 34 may be of the same composition as first self-assembly material 26, or materials 26 and 34 may be of different compositions.

Directed self-assembly of the second self-assembly material that is over the second features is induced to form a two-dimensional pattern of second lines that individually comprise at least one of (a): the second features and a remnant of the second self-assembly material that is longitudinally between immediately adjacent of the second features within and along an individual of the first lines, and (b): a line of a remnant of the second self-assembly material that is laterally between and laterally spaced from immediately adjacent of the first lines. Both (a) and (b) may occur, or only one and not the other. Referring to FIGS. 12-15, an embodiment is shown wherein both (a) and (b) has occurred. For example, directed self-assembly of material 34 has been induced to form a pattern of second lines 40*a*, 40*b*, 40*c*, 40*d*, 40*e*, 40*f*, 40*g*, 40*h*, 40*i*, 40*j*, and 40*k*. At least two self-assembled features would form with one being removed to leave example remnant material 34, for example as shown and described above with reference to FIGS. 4-6. Again, self-assembly into more than two components may occur.

Second lines 40*b*, 40*c*, 40*f*, and 40*i* individually comprise second features 32 and a remnant of second self-assembly material 34 longitudinally between immediately adjacent second features 32 within and along an individual of the first lines (e.g., first lines 28*a-d* as shown in FIG. 5). Second lines 40*g* and 40*h* individually comprise a line of a remnant second self-assembly material 34 laterally between and laterally spaced from immediately adjacent of the first lines (e.g., first lines 28*b* and 28*d* in FIG. 5). Example additional second lines 40*a*, 40*e*, 40*d*, 40*j*, and 40*k* are also shown as being formed by self-assembly. Additionally, lines (not shown) may form by self-assembly immediately laterally outward of second lines 40*a*, 40*e*, 40*d*, and 40*j*.

Figure 15:
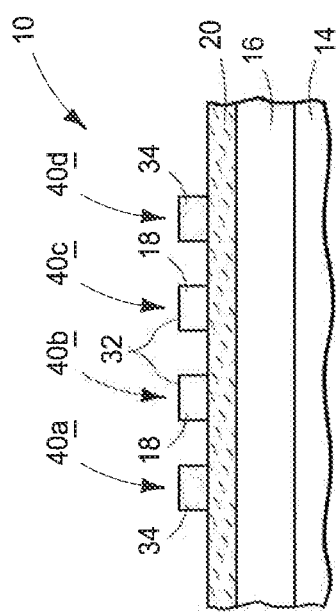
FIG. 15 is a sectional view taken through line 15-15 in FIG. 12.
Figure 16:
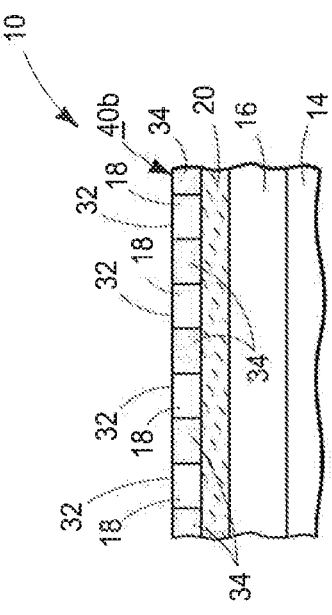
FIG. 16 is a sectional view of a substrate fragment in process in accordance with an embodiment of the invention.

The self-assembled material of second lines 40*a*-40*k* may form, by way of example, as surface parallel cylinders or lamellae, for example depending upon the composition of the chosen self-assembly material. Where formed of surface parallel cylinders, elevationally outermost surfaces of second projecting features 32 in second lines 40*b*, 40*c*, 40*f*, and 40*i* will likely be elevationally outwardly exposed as shown. Where such second lines comprise lamella between immediately adjacent second features, the material of self-assembly might or might not be over elevationally outermost surfaces of second projecting features 32. For example, FIG. 16 shows an example alternate embodiment substrate fragment 10*s* to that depicted by FIG. 15. Like numerals from the above-described embodiments have been used where appropriate, with some construction differences being indicated with the suffix "s". FIG. 16 may be considered as showing lamellae formation of second self-assembly material 34*s* whereby material 34*s* after self-assembly is shown covering elevationally outermost surfaces of second projecting features 32.

Figure 18:
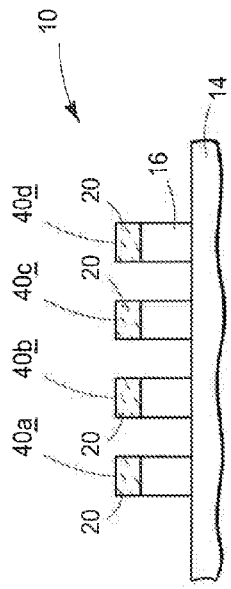
FIG. 18 is a sectional view taken through line 18-18 in FIG. 17.
Figure 19:
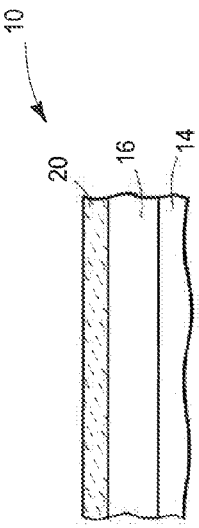
FIG. 19 is a sectional view taken through line 19-19 in FIG. 17.
Figure 17:
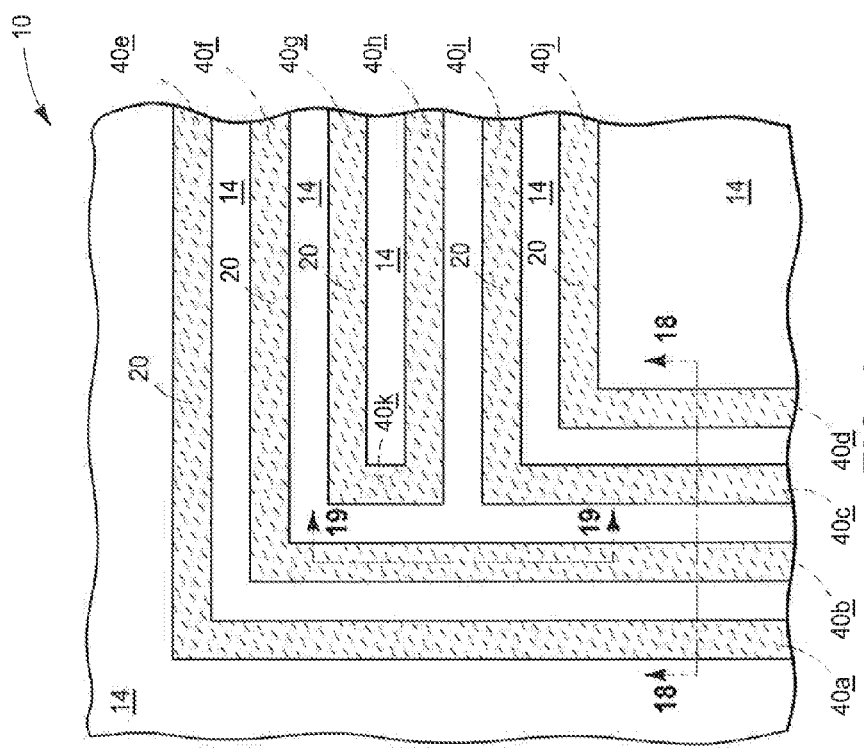
FIG. 17 is a diagrammatic top plan view of the FIG. 12 substrate at a processing step subsequent to that shown by FIG. 12.

Substrate material that is elevationally inward of and laterally between second lines 40*a*-40*k* may be processed using those second lines as a mask. Such processing, by way of example, may include etching using the second lines as a mask, deposition using the second lines as a mask, and/or ion implantation using the second lines as a mask. FIGS. 17-19 by way of example show subsequent processing of etching. Second lines 40*a*-40*k* of first material 18 (not shown) and material 34 (not shown) have been used as a mask while etching through second material 20 and material 16, with materials 18 and 34 of second lines 40*a*-40*k* having been removed during and/or subsequent to such etching. Elevationally outermost surfaces of the second features might or might not be completely covered during the etching (or other processing), for example depending upon whether an embodiment like FIG. 16 or an embodiment like that of FIG. 15 is used as a mask. In one embodiment, the second features are used as a mask while etching the second material (e.g., material 20) selectively relative to elevationally exposed portions of the first material (e.g., material 18). In one embodiment, the first material is removed from the substrate after such selective etching of the second material.

Figure 12:
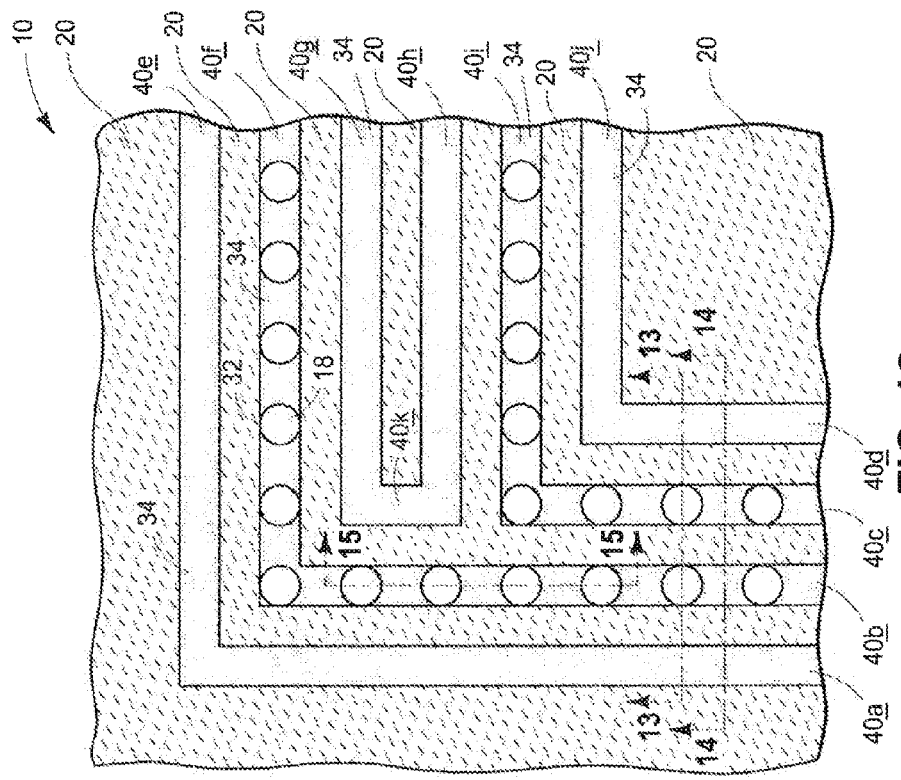
FIG. 12 is a diagrammatic top plan view of the FIG. 11 substrate at a processing step subsequent to that shown by FIG. 11.
Figure 20:
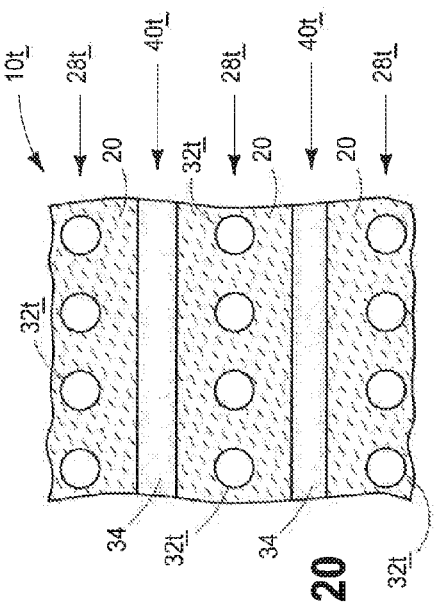
FIG. 20 is a sectional view of a substrate fragment in process in accordance with an embodiment of the invention.

FIGS. 12-15 show an example embodiment wherein more than one second line is formed laterally between and laterally spaced from immediately adjacent first lines at some location on the substrate (e.g., two second lines 40*g*, 40*h* in FIG. 12 that are between first lines 28*b* and 28*d* in FIG. 5). Alternately, only a single second line might be formed laterally between and laterally spaced from immediately adjacent of the first lines at some location on the substrate, for example as shown with respect to a substrate fragment 10*t* in FIG. 20. Like numerals from the above-described embodiments have been used where appropriate, with some construction differences being indicated with the suffix "t". FIG. 20 is a top-plan view comprising second features 32*t* formed along first lines 28*t*. Only a single self-assembled second line 40*t* has been formed laterally between and laterally spaced from immediately adjacent of first lines 28*t* at some location (i.e., at least one location) on the substrate. Where processing is to occur of substrate material that is elevationally inward and laterally between second lines 40t using those lines as a mask, spaced projecting features 32t might be removed prior to such processing or might remain on the substrate during such processing. Further and regardless, material (not shown in FIG. 20) may be formed longitudinally between second features 32t to fill longitudinal gaps between those second projecting features. That material might be removed prior to such processing or might not be removed prior to such processing.

An embodiment of the invention encompasses using a plurality of longitudinally spaced projecting features (e.g., features 30) formed along respective guidelines (e.g., lines 28a-d) as a template in forming a plurality of directed self-assembled (DSA) lines that individually comprise the spaced projecting features and DSA material longitudinally there-between. An example such embodiment is shown with respect to DSA lines 40b, 40c, 40f, and 40i in FIGS. 12-15, and independent of whether lines 40a, 40e, 40g, 40h, 40k, and 40j are present. Further, such method is independent of whether the spaced projecting features (e.g., features 30) themselves have been formed using directed self-assembly. However in one embodiment, those spaced projecting features (e.g., features 30) may be formed using directed self-assembly. Further, the spaced projecting features may be formed by directed self-assembly to comprise spaced raised features (e.g., features 30) that are used as a mask while etching underlying material (e.g., material 15) between those spaced raised features, whereby the spaced projecting features (e.g., features 32) comprise that underlying material (e.g., as shown in FIG. 8). Regardless, substrate material elevationally inward of and laterally between the DSA lines (e.g., lines 40b/40c and 40f/40i) may be processed using those DSA lines as a mask.

In one embodiment, the spaced raised features (e.g., features 30) are removed from the substrate prior to the processing. Regardless, such processing may be as described above, namely etching, deposition, and/or ion implantation as examples only. Additionally, a plurality of DSA lines that are individually and laterally between and laterally spaced from immediately adjacent of the guidelines might be formed (e.g., lines 40g, 40h), with the mask that is used during the processing comprising those DSA lines. Only one (not shown) or more than one (e.g., two lines 40g, 40h being shown) such DSA lines may form between immediately adjacent of the guidelines (e.g., lines 28b and 28d). Any other attribute as described above may be used.

In one embodiment, a method comprises using a plurality of spaced projecting features (e.g., features 30) formed along respective guidelines (e.g., lines 28a-d) as a template in forming a plurality of DSA lines (e.g., lines 40g, 40h) that are individually laterally between and laterally spaced from immediately adjacent of the guidelines, and independent of whether DSA lines are formed that individually comprise the spaced projecting features and DSA material longitudinally there-between. Only one (not shown) or more than one (e.g., two lines 40g, 40h being shown) such DSA lines may form between immediately adjacent of the guidelines (e.g., lines 28b and 28d). Regardless, substrate material elevationally inward of and laterally between the DSA lines may be processed using the DSA lines as a mask. Any other attribute as described above may be used.

CONCLUSION

In some embodiments, a method comprises forming a line pattern in a substrate and comprises using a plurality of longitudinally spaced projecting features formed along respective guide lines as a template in forming a plurality of directed self-assembled (DSA) lines that individually comprise the spaced projecting features and DSA material longitudinally there-between. Substrate material that is elevationally inward of and laterally between the DSA lines is processed using the DSA lines as a mask.

In some embodiments, a method comprises forming a line pattern in a substrate and comprises using a plurality of longitudinally spaced projecting features formed along respective guide lines as a template in forming a plurality of directed self-assembled (DSA) lines that individually are laterally between and laterally spaced from immediately adjacent of the guide lines. Substrate material that is elevationally inward of and laterally between the DSA lines is processed using the DSA lines as a mask.

In some embodiments, a method of forming a line pattern in a substrate comprises inducing directed self-assembly of a first self-assembly material to form a two-dimensional pattern of first lines that individually comprise longitudinally spaced first projecting features. Second projecting features are formed in material underlying the first features using the first features as a mask. Directed self-assembly of a second self-assembly material that is over the second features is induced to form a two-dimensional pattern of second lines that individually comprise at least one of (a): the second features and a remnant of the second self-assembly material that is longitudinally between immediately adjacent of the second features within and along an individual of the first lines, and (b): a line of a remnant of the second self-assembly material that is laterally between and laterally spaced from immediately adjacent of the first lines.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method comprising forming a line pattern in a substrate, comprising:
   using a plurality of longitudinally spaced projecting features formed along respective guide lines as a template in forming a plurality of directed self-assembled (DSA) lines that individually comprise the spaced projecting features and DSA material longitudinally there-between, the DSA material longitudinally there-between having a maximum width orthogonal longitudinal orientation of individual of the DSA lines that is no greater than maximum width of the longitudinally spaced projecting features orthogonal the longitudinal orientation; and
   processing substrate material elevationally inward of and laterally between the DSA lines using the DSA lines as a mask.

2. The method of claim 1 comprising forming the spaced projecting features using directed self-assembly.

3. The method of claim 1 comprising also forming a plurality of DSA lines that individually are laterally between and laterally spaced from immediately adjacent of the guide lines, the mask comprising the DSA lines while conducting said processing.

4. The method of claim 1 wherein the DSA material is a polymer of a block copolymer.

5. The method of claim 1 wherein the DSA material comprises a surface parallel cylinder.

6. The method of claim 1 wherein the DSA material comprises a lamella.

7. The method of claim 1 wherein the spaced first features are not longitudinally elongated in horizontal cross section in longitudinal direction of the line.

8. The method of claim 1 wherein the spaced first features are one of circular, triangular, or quadrilateral in horizontal cross section.

9. The method of claim 1 wherein the DSA material longitudinally there-between has said maximum width equal to said maximum width of the longitudinally spaced projecting features.

10. A method comprising forming a line pattern in a substrate, comprising:
using a plurality of longitudinally spaced projecting features formed along respective guide lines as a template in forming a plurality of directed self-assembled (DSA) lines that individually comprise the spaced projecting features and DSA material longitudinally there-between;
processing substrate material elevationally inward of and laterally between the DSA lines using the DSA lines as a mask; and
comprising forming the spaced projecting features using directed self-assembly, the forming the spaced projecting features comprising directed self-assembly to form spaced raised features that are used as a mask while etching underlying material between the spaced raised features, the spaced projecting features comprising the underlying material.

11. The method of claim 10 comprising removing the spaced raised features from the substrate prior to said processing.

12. A method comprising forming a line pattern in a substrate, comprising:
using a plurality of longitudinally spaced projecting features formed along respective guide lines as a template in forming a plurality of directed self-assembled (DSA) lines that individually are laterally between and laterally spaced from immediately adjacent of the guide lines;
processing substrate material elevationally inward of and laterally between the DSA lines using the DSA lines as a mask; and
comprising forming material longitudinally between the spaced projecting features to fill longitudinal gaps between the spaced projecting features, said material that is in the gaps having a maximum width orthogonal longitudinal orientation of individual of the guide lines that is no greater than maximum width of the longitudinally spaced projecting features orthogonal the longitudinal orientation, and removing said material that is in the gaps prior to the processing.

13. The method of claim 12 comprising forming more than one DSA line laterally between and laterally spaced from immediately adjacent of the guide lines at some location.

14. The method of claim 12 comprising removing the spaced projecting features from the substrate prior to the processing.

15. The method of claim 12 wherein the processing is conducted while the spaced projecting features remain on the substrate.

16. The method of claim 12 comprising forming the spaced projecting features using directed self-assembly.

17. The method of claim 12 comprising forming the spaced projecting features using a technique other than directed self-assembly.

18. A method comprising forming a line pattern in a substrate, comprising:
using a plurality of longitudinally spaced projecting features previously formed along respective guide lines as a template in later forming a plurality of directed self-assembled (DSA) lines that individually are laterally between and laterally spaced from immediately adjacent of the guide lines;
processing substrate material elevationally inward of and laterally between the DSA lines using the DSA lines as a mask; and
comprising forming only a single DSA line laterally between and laterally spaced from immediately adjacent of the guide lines at some location.

19. The method of claim 18 comprising forming the spaced projecting features using a technique other than directed self-assembly.

20. A method comprising forming a line pattern in a substrate, comprising:
using a plurality of longitudinally spaced projecting features formed along respective guide lines as a template in forming a plurality of directed self-assembled (DSA) lines that individually are laterally between and laterally spaced from immediately adjacent of the guide lines;
processing substrate material elevationally inward of and laterally between the DSA lines using the DSA lines as a mask; and
comprising forming material longitudinally between the spaced projecting features to fill longitudinal gaps between the spaced projecting features, said material that is in the gaps having a maximum width orthogonal longitudinal orientation of individual of the guide lines that is no greater than maximum width of the longitudinally spaced projecting features orthogonal the longitudinal orientation, and removing said material that is in the gaps prior to the processing.

21. The method of claim 20 wherein said material that is in the gaps has said maximum width equal to said maximum width of the longitudinally spaced projecting features.

22. A method of forming a line pattern in a substrate, comprising:
inducing directed self-assembly of a first self-assembly material to form a two-dimensional pattern of first lines that individually comprise longitudinally spaced first projecting features;
forming second projecting features in material underlying the first features using the first features as a mask; and
inducing directed self-assembly of a second self-assembly material that is over the second features to form a two-dimensional pattern of second lines that individually comprise at least one of (a): the second features and a remnant of the second self-assembly material that is longitudinally between immediately adjacent of the second features within and along an individual of the first lines, and (b): a line of a remnant of the second self-assembly material that is laterally between and laterally spaced from immediately adjacent of the first lines.

23. The method of claim 22 wherein the first and second self-assembly materials are of the same composition.

24. The method of claim 22 wherein the first and second self-assembly materials are of different compositions.

25. The method of claim 22 comprising both (a) and (b).

26. The method of claim 22 comprising (a) and not (b).

27. The method of claim 22 comprising (b) and not (a).

28. The method of claim 22 comprising removing the first features after forming the second features and before the inducing directed self-assembly of the second self-assembly material.

29. The method of claim 22 comprising processing substrate material elevationally inward of and laterally between the second lines using the second lines as a mask.

30. The method of claim 29 comprising (a) and wherein the processing comprises etching, elevationally outermost surfaces of the second features being exposed during the etching.

31. The method of claim 29 comprising (a) and wherein the processing comprises etching, elevationally outermost surfaces of the second features being completely covered during the etching.

32. The method of claim 22 wherein the directed self-assembly of the first lines uses a pattern in photoresist as a template.

33. The method of claim 22 wherein the directed self-assembly of the first lines comprises:
   forming a pattern in photoresist that is over underlying masking material;
   etching into the masking material using the photoresist as a mask; and
   removing the photoresist and thereafter using the masking material as a template during the directed self-assembly of the first lines.

34. The method of claim 22 wherein the material underlying the first features comprises first and second different composition materials, the first material being elevationally over the second material, the forming of the second features comprising etching the first material selectively relative to the second material using the first features as a mask, the second features comprising the first material.

35. The method of claim 34 comprising after forming the second features, using the second features as a mask while etching the second material selectively relative to elevationally exposed portions of the first material.

36. The method of claim 35 comprising removing the first material from the substrate after the selectively etching of the second material.

37. The method of claim 22 wherein the second lines comprise surface parallel cylinders.

38. The method of claim 22 wherein the second lines comprise lamellae.

* * * * *